United States Patent [19]
Kitamura

[11] Patent Number: 5,488,367
[45] Date of Patent: Jan. 30, 1996

[54] METHOD OF AND APPARATUS FOR GENERATING VARIABLE LENGTH CODE TABLE

[75] Inventor: Takuya Kitamura, Kanagawa, Japan

[73] Assignee: Sony Corporation, Tokyo, Japan

[21] Appl. No.: 226,839

[22] Filed: Apr. 13, 1994

[30] Foreign Application Priority Data

Apr. 16, 1993 [JP] Japan .................................. 5-090263

[51] Int. Cl.⁶ ...................................................... H04N 7/24
[52] U.S. Cl. .............................................. 341/106; 341/67
[58] Field of Search ..................................... 341/106, 107, 341/67; 358/133, 135, 136, 138

[56] References Cited

U.S. PATENT DOCUMENTS 4,933,761  7/1990  Murakami et al. ...................... 358/133

Primary Examiner—Brian K. Young
Attorney, Agent, or Firm—William S. Frommer; Alvin Sinderbrand

[57] ABSTRACT

An apparatus for generating a variable length coding table comprises a compressing circuit for variable-length-code compressing input data and outputting statistic data representing an occurrence probability corresponding to a compressed code value obtained when input data is variable-length-coded, an expanding circuit for expanding data compressed by said compressing circuit, a distortion amount detecting circuit for detecting a distortion amount of output data from the expanding circuit by comparing the output data from the expanding circuit and the input data, and a variable length code table generating circuit for generating a variable length code table on the basis of statistic data outputted from the compressing circuit and a distortion amount outputted from the distortion amount detecting circuit.

8 Claims, 9 Drawing Sheets

FIG. 2

| DC Y | DC C(R-Y, B-Y) | AC1 Y | AC1 C(R-Y, B-Y) | ... | AC15 Y | AC15 C(R-Y, B-Y) |

FIG. 3

| DC | AC 01 | AC 02 | AC 03 |
|---|---|---|---|
| AC 10 | AC 11 | AC 12 | AC 13 |
| AC 20 | AC 21 | AC 22 | AC 23 |
| AC 30 | AC 31 | AC 32 | AC 33 |

Coefficient Data

FIG. 5 (PRIOR ART)

| Size | Value |
|---|---|
| 0 | 0 |
| 1 | -1, 1 |
| 2 | -3, -2, 2, 3 |
| 3 | -7~-4, 4~7 |
| 4 | -15~-8, 8~15 |
| 5 | -31~-16, 16~31 |
| 6 | -63~-32, 32~63 |
| 7 | -127~-64, 64~127 |
| 8 | -255~-128, 128~255 |
| 9 | -511~-256, 256~512 |
| 10 | -1023~-512, 512~1023 |

FIG. 6 (PRIOR ART)

| Size of Coefficient Data | Code |
|---|---|
| 0 | 00 |
| 1 | 01 |
| 2 | 10 |
| 3 | 110 |
| 4 | 1110 |
| 5 | 11110 |
| 6 | 111110 |
| 7 | 1111110 |
| 8 | 11111110 |
| 9 | 1111111100 |
| 10 | 1111111101 |
| 11 | 1111111110 |
| 12 | 11111111110 |
| 13 | 11111111111 |

FIG. 9 (PRIOR ART)

| | Size | 0 | 1 | 2 | 3 | 4 | 5 | 6 |
|---|---|---|---|---|---|---|---|---|
| | Occurrence Probability | 0.22 | 0.18 | 0.17 | 0.16 | 0.14 | 0.09 | 0.04 |
| A0 | | 0.22 | 0.18 | 0.17 | 0.16 | 0.14 | 0.09 | 0.04 |
| A1 | | 0.22 | 0.18 | 0.17 | 0.16 | 0.14 | 0.13 | |
| A2 | | 0.27 | 0.22 | 0.18 | 0.17 | 0.16 | | |
| A3 | | 0.33 | 0.27 | 0.22 | 0.18 | | | |
| A4 | | 0.40 | 0.33 | 0.27 | | | | |
| A5 | | 0.60 | 0.40 | | | | | |
| A6 | | 1.00 | | | | | | |
| Code Word | | 01 | 00 | 111 | 110 | 101 | 1001 | 1000 |

METHOD OF AND APPARATUS FOR GENERATING VARIABLE LENGTH CODE TABLE

BACKGROUND OF THE INVENTION

1. Field of the Invention

The present invention relates to method of and apparatus for generating a variable length code table for use with a variable length code table generating apparatus which generates a variable length code table used to generate a variable length code.

2. Description of the Prior Art

Digital VTRs (video tape recorders) that have been developed recently compress digital data (digital video and audio signals) when recording the same on a magnetic tape and expand the digital data when reproducing the same from the magnetic tape.

FIG. 1 of the accompanying drawings shows an example of a digital VTR of the type that digital data is compressed when it is recorded on a magnetic tape and that digital data is expanded when it is reproduced from the magnetic tape.

As shown in FIG. 1, in the video signal processing system of the digital VTR, a recording digital video signal is supplied to an input terminal 1 and then shuffled by a shuffling circuit 2 at every block of 4 pixels×4 pixels. Video data thus shuffled by the shuffling circuit 2 is supplied to and transformed by a DCT (discrete cosine transform) circuit 3 at the unit of blocks into coefficient data ranging from a DC component to a high-order AC component.

FIG. 2 shows an example of the coefficient data thus transformed. As shown in FIG. 2, the coefficient data thus transformed is comprised of coefficient data DC Y of DC component luminance signal, coefficient data DC C(R-Y, B-Y) of DC component color signal, coefficient data AC1 Y of AC component luminance signal, coefficient data AC1 C(R-Y, B-Y) of AC component color signal, . . . coefficient data AC15 Y of AC component luminance signal and coefficient data AC15 C(R-Y, B-Y) of AC component color signal.

The above-mentioned coefficient data from the DCT circuit 3 are supplied to a quantization controller 4 which determines quantizaion index such that 10 blocks of a luminance signal Y and 5 blocks of each of color difference signals R-Y, B-Y of the coefficient data (shown in FIG. 2) supplied thereto fall within a block (i.e., so-called sync. block) recorded on a magnetic tape 17. A step size, which will be described later on, is obtained on the basis of the quantization index, and coefficient data is quantized by the step size obtained from the quantization index. Therefore, the coefficient data from the quantization controller 4 are supplied to a quantizer 5, in which they are quantized on the basis of the step size obtained from the quantization index.

The coefficient data quantized by the quantizer 5 are supplied to a VLC (variable length code) encoder 6. The VLC encoder 6 encodes the coefficient data supplied thereto to provide variable length coded quantized coefficient data by using an entropy code. The quantized coefficient data thus processed by the VLC encoder 6 are temporarily stored and rearranged at every sync. block by a buffer memory 7. The data from the buffer memory 7 are supplied to an outer code circuit 8, in which they are added with an outer code parity and then supplied to a mixer 12.

On the other hand, in the audio signal processing system of the digital VTR, a recording digital audio signal is supplied to an input terminal 9. The digital audio signal supplied to the input terminal 9 is shuffled by a shuffling circuit 10, and the audio data thus shuffled by the shuffling circuit 10 is added with an outer code parity by an outer code circuit 11. Then, the audio data processed by the outer code circuit 11 is supplied to the mixer 12.

The mixer 12 mixes the video data supplied thereto from the outer code circuit 8 and the audio data supplied thereto from the outer code circuit 11 to provide mixed data. The mixed data from the mixer 12 is supplied to an inner code circuit 13, in which it is added with an inner code parity and supplied to a channel encoder 14. Data channel-encoded by the channel encoder 14 is supplied through a recording amplifier 15 to a magnetic head 16, thereby being recorded on the magnetic tape 17 so as to form slant tracks.

Processing in the VLC encoder 6 will be described. The DCT circuit 3 transforms the input data into the coefficient data ranging from DC component to the high-order AC component as earlier noted with reference to FIG. 2. The DCT circuit 3 scans coefficient data in a zigzag fashion as shown in FIG. 3. FIG. 3 shows the case that the coefficient data are scanned from DC component coefficient data DC to high-order AC component coefficient data AC33.

The VLC encoder 6 shown in FIG. 1 encodes the DC component coefficient data DC of the zigzag-scanned coefficient data to provide a fixed length code. The VLC encoder 6 encodes AC component coefficient data AC1 through AC15 (AC01 through AC33 in the example shown in FIG. 3) to provide variable length codes.

Processing for encoding the AC component coefficient data AC1 through AC15 into variable length codes will be described with reference to a flowchart of FIG. 4.

Referring to FIG. 4, following the start of operation, sizes of coefficient data are calculated in step S1. Sizes of coefficient data are calculated on the basis of a table (shown in FIG. 5) which is used to obtain sizes of coefficient data. The table shown in FIG. 5 indicates numerical values representing values of coefficient data on the right-hand columns thereof and numerical values representing sizes corresponding to values of coefficient data on the left-hand columns thereof. Then, the processing proceeds to step S2.

In step S2, sizes of coefficient data are coded on the basis of a coefficient table shown in FIG. 6. The coefficient table shown in FIG. 6 is used to obtain codes corresponding to sizes of coefficient data. The table shown in FIG. 6 indicates numerical values representing values of sizes obtained from the table shown in FIG. 5 on the left-hand columns thereof and codes representing codes corresponding to the values of the sizes on the right-hand columns thereof. Then, the processing proceeds to step S3.

In step S3, values of coefficient data are calculated. The value of coefficient data teaches the order in which the value of coefficient data is placed on the right-hand column corresponding to the corresponding size of the table (shown in FIG. 5) which obtains sizes of coefficient data. The minimum value is assumed to be "0" when counted in the values corresponding to the sizes of coefficient data. Then, the processing proceeds to step S4.

In step S4, the values thus obtained are expressed by corresponding bits of large sizes (referred to hereinafter as "(size) bit"), i.e., information representing the sequential order is converted into (size) bit. Then, the processing proceeds to step S5.

In step S5, coefficient data is coded by adding coded size and value of (size) bit. More specifically, the size obtained in accordance with the value of coefficient data on the table shown in FIG. 6 is converted into the code. Then, the (size)

bit which results from converting the value indicative of the sequential order of the value of coefficient data in the size area is added to the coded size, thus the variable length code being obtained. Then, the processing returns to step S1, and the variable length coding is repeated similarly as described above.

The variable length coding will be described more fully with reference to FIGS. 5 and 6.

When coefficient data is "−21", a size of the coefficient data "−21" is "5" as shown on the table of FIG. 5. As shown in FIG. 5, the coefficient value corresponding to the size "5" falls in a range of from −31 to −16 and from 16 to 31. Therefore, when the coefficient value "−31" is counted as 0 th coefficient value, the coefficient value "−21" is 10 th coefficient value so that the coefficient data "−21" has a value "10". The code of size "5" is "11110" and the value "10" is expressed as "01010" by (size) bits, i.e., 5 bits. Thus, the variable length code of the coefficient value "−21" is obtained as "1111001010" by adding "11110" and "01010".

When the coefficient data is "5", the size of the coefficient data having the value "5" is "3" as shown in FIG. 5. The coefficient value corresponding to the size "3" falls in a range of from −7 to −4 and from 4 to 7 as shown in FIG. 5. In the column of the size "3", the value of coefficient data having the value "5" is 5 th coefficient value when the coefficient data value "−7" is counted as 0 th coefficient value. Therefore, the coefficient data "5" has a value "5". The code of the size "3" is "110" as shown in FIG. 6, and the value "5" is expressed as "101" by (size) bits, i.e., 3 bits. Thus, the variable length code of the coefficient value "5" is expressed as "110101" by adding "110" and "101".

In this digital VTR, the total code length obtained when digital data is compressed depends upon the table (shown in FIG. 6) which converts the size into the code. Therefore, not only the VLC encoder 6 shown in FIG. 1 but also the quantization controller 4 includes the table information shown in FIG. 6. Accordingly, the quantization controller 4 determines the quantization index such that data fall within one sync. block. Then, the quantization controller 4 supplies the quantization index to the quantizer 5 as shown in FIG. 1.

Since the quantization index is the immediate cause of a distortion in the data obtained when the data is rearranged, it is very important to determine the above-mentioned table (see FIG. 6) which obtains the code from the size.

Therefore, the table (see FIG. 6) which obtains codes from sizes is generated by the procedure shown in FIG. 7. Processing for generating the table which obtains codes from sizes will be described below with reference to a flowchart of FIG. 7. This table will be referred hereinafter to as "conversion table" for simplicity. Also, let it be assumed that steps of the flowchart of FIG. 7 are not executed by the digital VTR shown in FIG. 1 but by a system which is arranged exclusively. Accordingly, steps of the flowchart of FIG. 7 will be described on the assumption that respective elements which construct the digital VTR shown in FIG. 1 are forming a conversion table generating apparatus.

Referring to FIG. 7, following the start of operation, the processing proceeds to step S10, whereat a proper conversion table is set, i.e., a suitable conversion table is loaded onto the quantization controller 4 shown in FIG. 1. Then, the processing proceeds to step S11.

In step S11, all data are inputted. Inputting all data means that data are inputted at a practical frequency, e.g., video signals of all sorts of patterns are supplied to the input terminal 1 shown in FIG. 1. Then, the processing proceeds to step S12.

In step S12, statistic of data inputted to the VLC encoder 6 shown in FIG. 1 is calculated. In other words, statistic of data outputted from the quantizer 5 shown in FIG. 1, i.e., an incidence probability of sizes obtained by the conversion table shown in FIG. 5 is calculated. Then, the processing proceeds to step S13.

In step S13, a new conversion table is generated by the Huffman code method on the basis of the statistic, i.e., new conversion table is generated by the Huffman code method on the basis of the statistic that was obtained by the output from the quantizer 5 shown in FIG. 1. Then, the processing proceeds to the next decision step S14.

It is determined in decision step S14 whether or not the new conversion table is the same as the former conversion table. If a YES is outputted at decision step S14, then the processing is ended. That is, if the new conversion table is the same as the former conversion table as represented by a YES at decision step S14, it is to be appreciated that the table is converged. Therefore, the new conversion table is determined as the conversion table (shown in FIG. 6) for obtaining the code from the size. If a NO is outputted at decision step S14, then the processing proceeds to step S15.

In step S15, the new conversion table is set, and the processing returns to step S10.

The above-mentioned method of generating conversion tables will be described more fully below. Initially, the quantization index is determined by using a proper conversion table such that data may fall within one sync. block. When the statistic of data quantized by the resultant quantization index is calculated on the basis of the size, the resultant statistic data becomes different from the statistic data obtained before the proper conversion table is used. Therefore, the new conversion table is generated on the new statistic data thus obtained.

The quantization index is determined by using the new conversion table, and the statistic amount of data quantized at that time is calculated. When the statistic amount of data obtained after the new conversion table is generated last and the statistic amount of data quantized by using the new conversion table generated this time are compared with each other, the resultant statistic amount is different. Therefore, a new conversion table is generated on the basis of the resultant statistic amount. If the similar table generating processing is repeated, then new conversion tables thus obtained are converged to a certain table in which the statistic amount obtained when the conversion table is generated and the statistic amount obtained when the processing is carried out by using the table thus generated become coincident with each other. This conversion table is a target conversion table.

The procedure for generating a new conversion table by the Huffman code method as shown at step S13 in the flowchart of FIG. 7 will be described with reference to a flowchart of FIG. 8.

Referring to FIG. 8, following the start of operation, the processing proceeds to step S20, whereat sizes are arranged in the order of large occurrence probability. Then, the processing proceeds to step S21.

In step S21, the minimum occurrence probability and the second minimum occurrence probability are degenerated to produce a new size. The occurrence probability of the new size is represented by a sum of the minimum occurrence probability and the second minimum occurrence probability. A code bit "0" is assigned to the small occurrence probability and a code bit "1" is assigned to the large occurrence probability. Then, the processing proceeds to decision step S22.

It is determined in decision step S22 whether or not only occurrence probability "1" is obtained after step S21 is executed. If a YES is outputted at decision step S22, then the processing is ended. If on the other hand a NO is outputted at decision step S22, then the processing returns to step S20.

According to the above-mentioned processing, the code word of short code length is assigned to a size having large occurrence probability and the cord word of long code length is assigned to a size having small occurrence probability.

The arrangement of variable length code obtained by the Huffman code method will be described with reference to FIG. 9. In this case, let it be assumed that sizes are "0" to "6" and that occurrence probabilities of these sizes "0" to "6" are 0.22, 0.18, 0.17, 0.16, 0.14, 0.09 and 0.04, respectively. In FIG. 9, reference symbols "A0" through "A6" depict step Nos.

As shown in FIG. 9, the initial state is expressed by the step A0. After steps S20 and S21 are executed, the step A0 proceeds to the step A1. Then, the step A1 proceeds to the step A2. After steps A0 to A6 are executed, the occurrence probability becomes "1" and the processing is ended. By way of example, when "1" is assigned to the occurrence probability of 0.09 and "0" is assigned to the occurrence probability of 0.04, a new occurrence probability of "0.13" is obtained in the step A1. In the next step A2, the code bits "1" and "0" are assigned to the occurrence probabilities of 0.17 and 0.16, respectively.

In the next step A3, a new occurrence probability of "0.33" is obtained from the occurrence probabilities of 0.17 and 0.16. In the next step A4, the code bits "1" and "0" are assigned to the occurrence probabilities of 0.22 and 0.18. Then, a new occurrence probability of "0.40" is obtained from the occurrence probabilities of 0.22 and 0.18.

In the next step A5, the code bits "1" and "0" are assigned to occurrence probabilities of 0.33 and 0.27, respectively. Then, a new occurrence probability of "0.60" is obtained from the occurrence probabilities of 0.33 and 0.27. In the next step A6, the code bits "1" and "0" are assigned to occurrence probabilities of 0.60 and 0.40, respectively. Then, a new occurrence probability of "1.00" is obtained from the occurrence probabilities of 0.60 and 0.40.

Therefore, according to this example, a code word "01" is assigned to the size "0", a code word "00" is assigned to the size "1", a code word "111" is assigned to the size "2", a code word "110" is assigned to the size "3", a code word "101" is assigned to the size "4", a code word "1001" is assigned to the size "5", and a code word "1000" is assigned to the size "6".

The size "6" will be described below by way of example. Initially, in the step A1, the code bit "0" is assigned to the occurrence probability of 0.04 of the size "6", and a new occurrence probability of 0.13 is obtained from the occurrence probability of 0.04 of the size "6" and the occurrence probability of 0.09 of the size "5". In the next step A2, the code bit "0" is assigned to the new occurrence probability of 0.13.

Having followed the arrows in FIG. 9, we have occurrence probability of 0.27 in step A4 after occurrence probabilities of 0.27, 0.27 are obtained in steps A2, A3. In the next step A5, the code bit "0" is assigned to the occurrence probability of 0.27. Then, following the arrow, we have occurrence probability of 0.60 in step A6. In step A6, the code bit "1" is assigned to the occurrence probability of 0.60. Accordingly, following the assigned code bits "1", "0", "0", "0" in the opposite direction, we have a code word "1000" that is assigned to the occurrence probability of 0.04 of the size "6".

When tables are generated as described above, the problem is to input and compress data as much as one can consider. In the case of the VTR, for example, the problem is to input incoming image data at the practical frequency. It is, however, almost impossible to generate tables by inputting incoming image data at the practical frequency, i.e., inputting image data of all sorts of patterns.

SUMMARY OF THE INVENTION

In view of the aforesaid aspects, it is an object of the present invention to provide method of and apparatus for generating a variable length code table which can generate practically useful variable length codes from input data of a relatively limited kind.

According to a first aspect of the present invention, there is provided an apparatus for generating a variable length coding table which is comprised of a compressing circuit for variable-length-code compressing input data and outputting statistic data representing an occurrence probability corresponding to a compressed code value obtained when input data is variable-length-coded, an expanding circuit for expanding data compressed by said compressing circuit, a distortion amount detecting circuit for detecting a distortion amount of output data from the expanding circuit by comparing the output data from the expanding means and the input data, and a variable length code generating circuit for generating a variable length code table on the basis of statistic data outputted from the compressing circuit and a distortion amount outputted from the distortion amount detecting circuit.

According to a second aspect of the present invention, there is provided a method of generating a variable length code which is comprised of the steps of variable-length code compressing input data, generating statistic data representing an occurrence probability of data corresponding to a length of a compressed cord word obtained when said input data is compressed, expanding the compressed data, detecting a distortion amount of the input data compressed and expanded by comparing the compressed and expanded data and the input data, and generating a variable length code table on the basis of the statistic data and the distortion amount.

BRIEF DESCRIPTION OF THE DRAWINGS

FIG. 2 is a diagram used to explain an arrangement of data obtained when a discrete cosine transform is carried out in the digital VTR shown in FIG. 1;

FIG. 3 is a schematic diagram used to explain a zigzag scanning of coefficient data obtained after the coefficient data are processed in a discrete cosine transform fashion in the digital VTR shown in FIG. 1;

FIG. 5 is a diagram showing a table from which there are obtained sizes of coefficient data according to the prior art;

FIG. 6 is a diagram showing a table that is used to assign variable length codes corresponding to sizes of coefficient data according to the prior art;

FIG. 9 is a diagram used to explain how to make variable length codes by a Huffman coding method according to the prior art;

DETAILED DESCRIPTION OF THE PREFERRED EMBODIMENT

An apparatus for generating a variable length code table according to an embodiment of the present invention will now be described in detail with reference to FIGS. 10 and 11.

Figure 10:
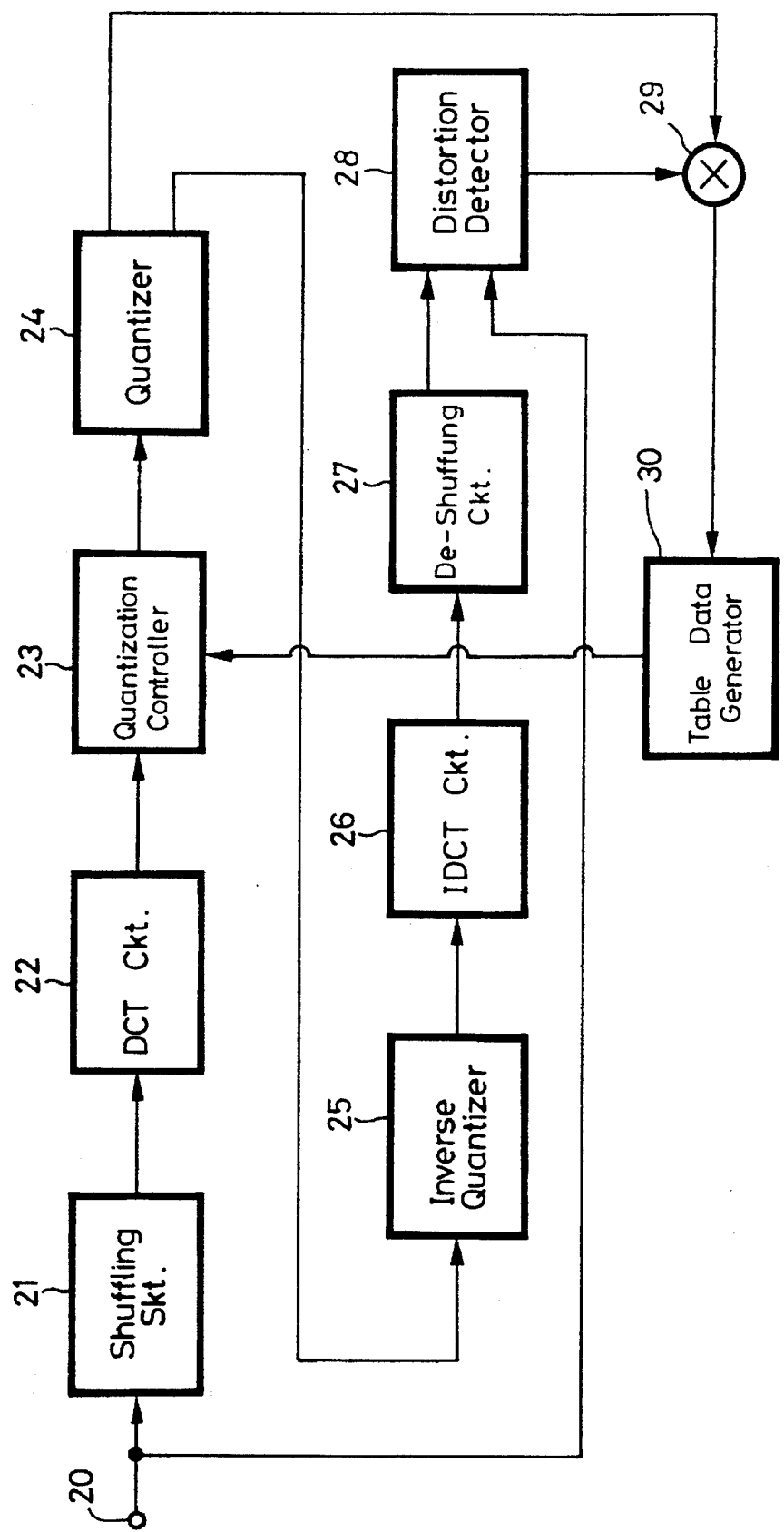
FIG. 10 is a block diagram showing method of and apparatus for generating a variable length code table according to an embodiment of the present invention.

As shown in FIG. 10, a video signal of a predetermined picture amount is repeatedly supplied to an input terminal 20 from some suitable means, such as a video signal generator (not shown) or the like. The video signal supplied to the input terminal 20 is supplied to and shuffled by a shuffling circuit 21, and supplied to a DCT circuit 22. The DCT circuit 22 transforms the shuffled video signal supplied thereto from the shuffling circuit 21 into coefficient data ranging from a DC component to a high-order AC component.

The coefficient data from the DCT circuit 22 is supplied to a quantization controller 23. The quantization controller 23 generates quantization index data on the basis of a table supplied thereto from a table data generator 30 which will be described later on. The quantization controller 23 quantizes coefficient data supplied thereto from the DCT circuit 22 by using the quantization index data thus generated, and supplies coefficient data thus quantized to a qunatizer 24.

The quantizer 24 quantizes the coefficient data supplied thereto on the basis of the quantization index data supplied thereto from the quantization controller 23. Also, the quantizer 24 calculates an occurrence probability of each of the coefficient sizes at the unit of several pictures, and supplies occurrence probabilities thus calculated to a multiplier 29 as statistic data.

Quantized coefficient data from the quantizer 24 is supplied to and inverse-quantized by an inverse quantizer 25, and supplied to an IDCT (inverse discrete cosine transform) circuit 26. The IDCT circuit 25 processes the inverse-quantized data supplied thereto from the inverse quantizer 25 in an IDCT fashion, and then supplied to a de-shuffling circuit 27, in which it is de-shuffled and then supplied to a distortion detector 28.

The distortion detector 28 detects a difference of distortion by comparing the output signal (i.e., rearranged video signal) supplied thereto from the de-shuffling circuit 27 and the original video signal (which is not yet compressed or expanded in time base) supplied thereto from the input terminal 20 by using some suitable means, such as an internal comparator (not shown) or the like. Then, the distortion detector 28 squares a difference thus obtained to provide distortion amount data and supplies the distortion amount data to the multiplier 29. The multiplier 29 multiplies the statistic data supplied thereto from the qunatizer 24 and the distortion data supplied thereto from the distortion detector 28 each other, and supplies a multiplied result to the table generator 30.

The table data generator 30 includes a memory (not shown) to accumulate multiplied results supplied thereto from the multiplier 29 during a predetermined period and generates table data for obtaining variable length codes from coefficient size data on the basis of data accumulated during a predetermined period. The table data generator 30 supplies table data thus generated to the quantization controller 23. According to the embodiment of the present invention, the table data for obtaining a variable length code from a coefficient size are obtained on the basis of the statistic considering the distortion amount, and the variable length code is obtained on the basis of table data which are obtained considering the distortion amount.

Image data which are easy to be compressed (i.e., image data which can be compressed with high compression ratio) have few distortion. On the other hand, data which are difficult to be compressed (i.e., image data which cannot be compressed with high compression ratio) have distortion inherently. More specifically, data (which can be compressed with ease) whose S/N (signal-to-noise ratio) is as satisfactory as about 70 dB would be lowered in S/N by an amount of about 60 or 65 dB at most unless the above-mentioned distortion amount were not taken into consideration. According to the present invention, it is intended to improve S/N of image data (which is difficult to be compressed) whose S/N is about 30 to 40 dB and which is little affected in picture quality.

Data which is easy or difficult to be compressed can be determined by a distortion of the rearranged data relative to the input data. Naturally, data having a large distortion is difficult to be compressed and data having a small distortion is easy to be compressed. According to the Huffman coding method, data having higher occurrence probability becomes a shorter code word so that table data which can obtain sufficiently practical codes can be generated from input data of relatively less kind by increasing an occurrence probability of an information source having much distortion, i.e., operating the statistic in consideration of distortion.

Operation of the variable length coding apparatus shown in FIG. 10 will be described below with reference to a flowchart of FIG. 11, centering the processing done by the table data generator 30 in particular.

Figure 11:
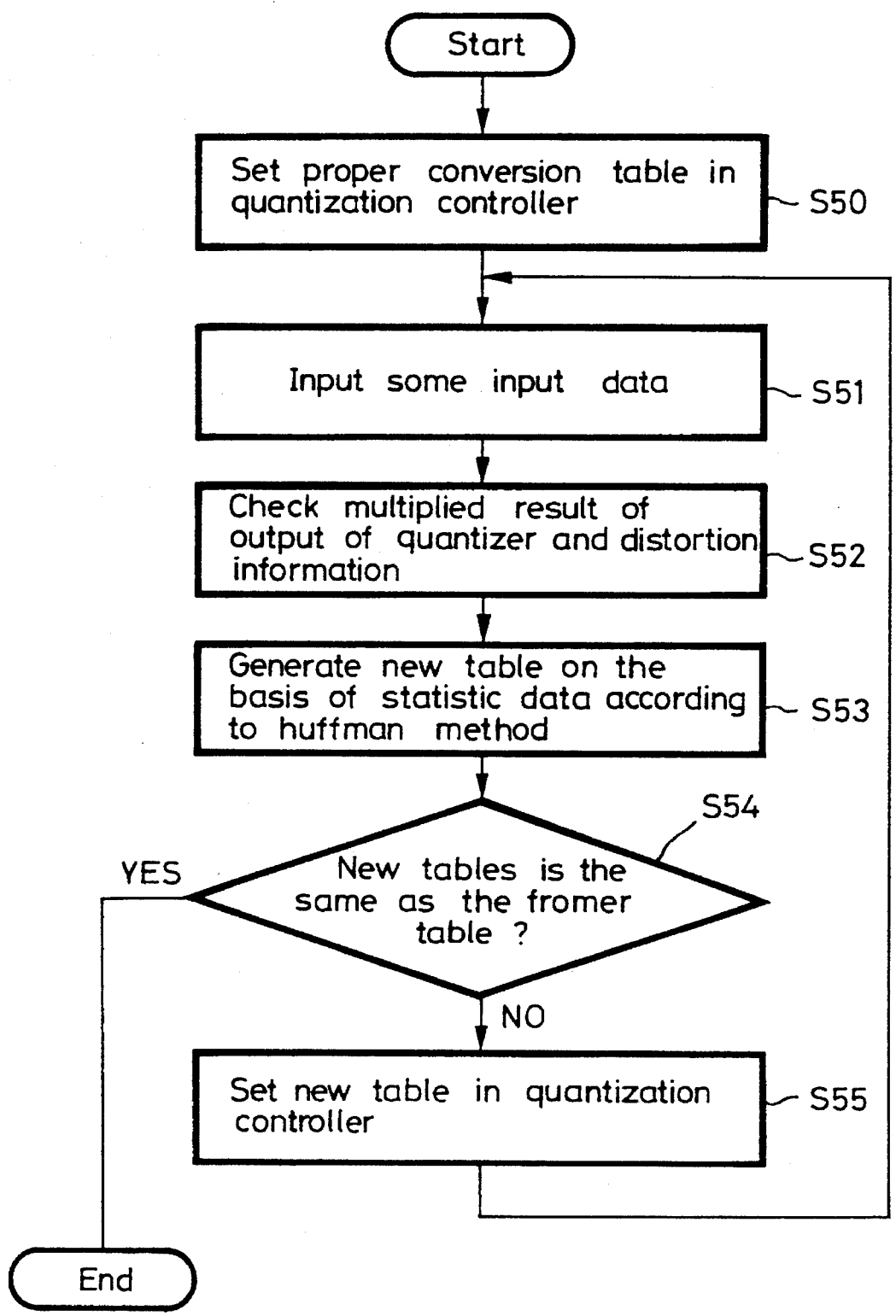
FIG. 11 is a flowchart to which reference will be made in explaining how to generate variable length codes according to the present invention.

Referring to FIG. 11, following the start of operation, a proper conversion table is set in the quantization controller 23 in step S50. Specifically, the table data generator 30 supplies table data of the proper conversion table (e.g., table having fixed values as initial values, etc.) to the quantization controller 23. The quantization controller 23 codes coefficient data from the DCT circuit 22 on the basis of table data supplied thereto to provide quantization index data supplied to the quantizer 24 such that coefficient data fall within one sync. block. Then, the processing proceeds to the next step S51.

In step S51, some input data are inputted (e.g., repeatedly inputting a video signal of a predetermined picture number, etc.). When input data is supplied to the DCT circuit 22 through the input terminal 21, the DCT circuit 22 processes the input data supplied thereto in a DCT fashion to provide coefficient data ranging from a DC component to a high-order AC component. Resultant coefficient data are supplied to the quantization controller 23. As described above, the quantization controller 23 converts the coefficient data into codes on the basis of table data supplied thereto as initial values from the table data generator 30, and supplies quantization index data to the quantizer 24 such that converted data fall in one sync. block.

The quantizer 24 quantizes coefficient data on the basis of quantization index data supplied thereto from the quantization controller 23 and also supplies statistic data to the multiplier 29. On the other hand, the quantized coefficient data from the quantizer 24 is supplied to the inverse quantizer 25, in which it is inverse-quantized and then supplied to the IDCT circuit 26. The quantized coefficient data is processed by the IDCT circuit 26 in an IDCT fashion, and then supplied through the de-shuffling circuit 27 to the distortion detector 28.

The distortion detector 28 detects a difference of distortion amount by comparing the video signal supplied thereto from the de-shuffling circuit 27 as the rearranged image data and the original data supplied thereto from the input terminal 20, and supplies distortion amount data thus obtained to the multiplier 29.

In step S52, statistic data which results from multiplying the statistic data which is the output of the quantizer 24 and the distortion information is checked. More specifically, the statistic data from the quantizer 24 is supplied to the multiplier 29, in which it is multiplied with the distortion amount data from the distortion detector 28 and the supplied to the table data generator 30. The multiplied result from the multiplier 29 is accumulated during a predetermined period (e.g., at the unit of several pictures). Then, the processing proceeds to the next step S53.

Figure 1:
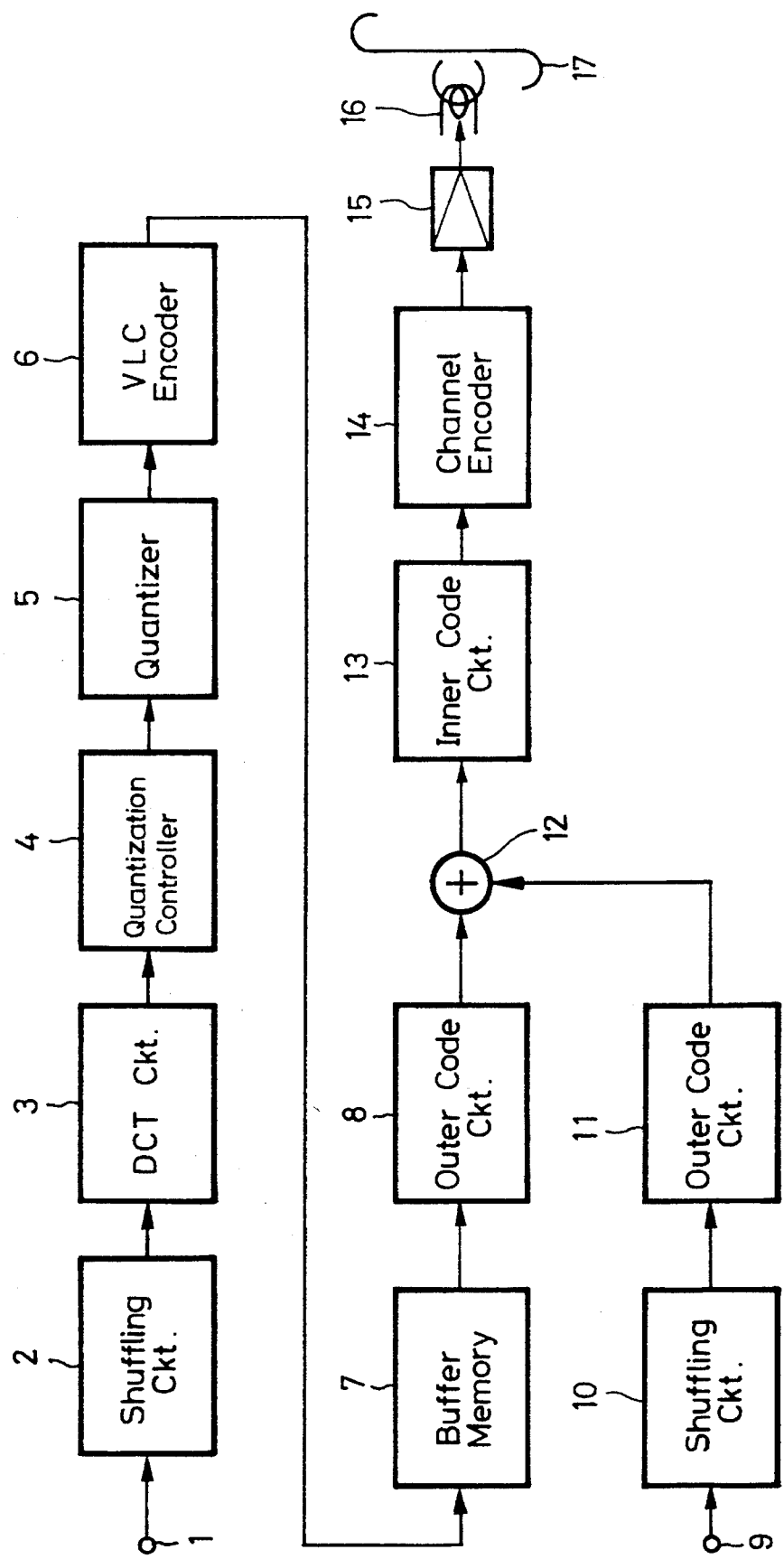
FIG. 1 is a block diagram showing a circuit arrangement of a recording system of a digital VTR.
Figure 4:
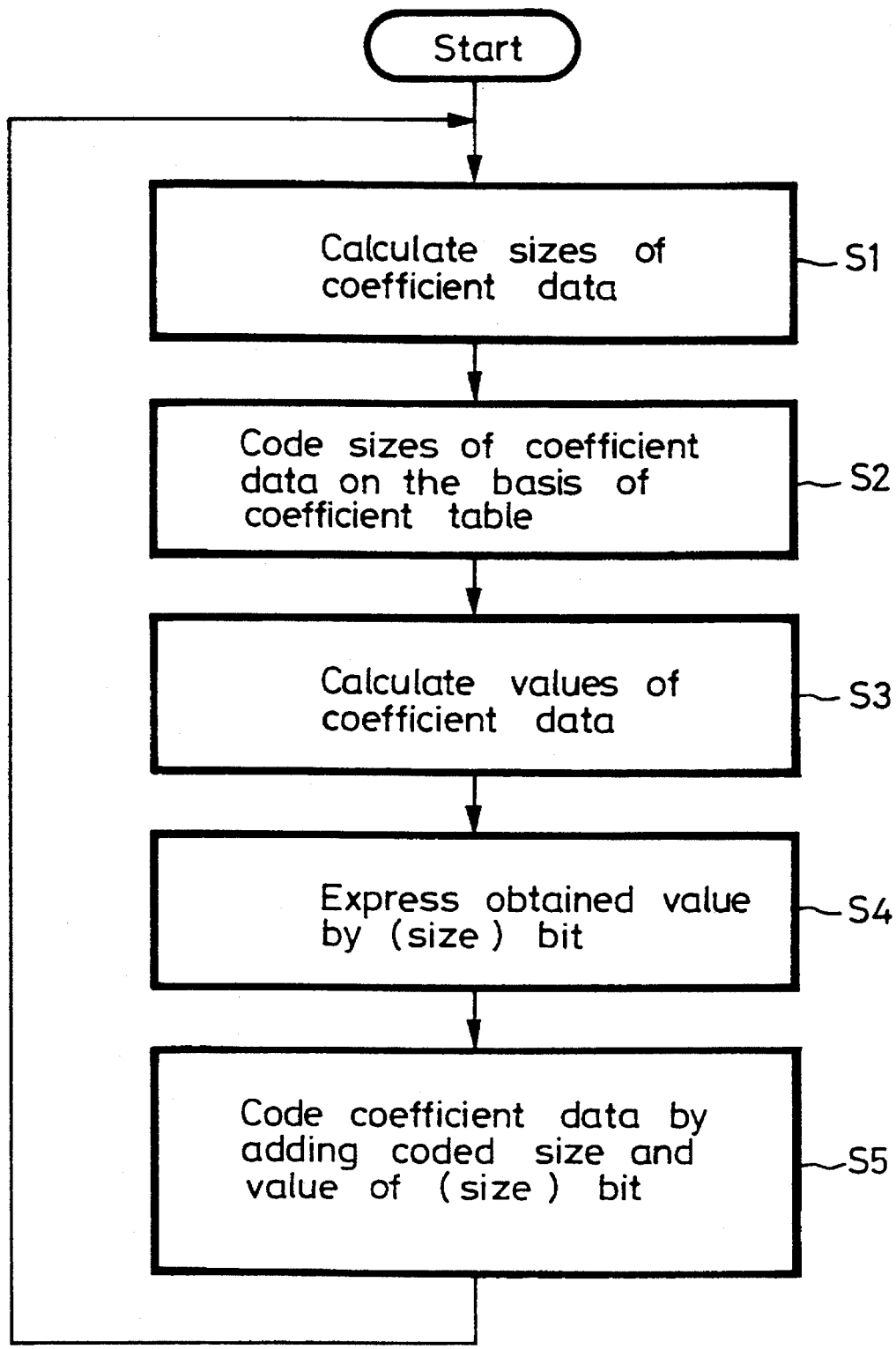
FIG. 4 is a flowchart to which reference will be made in explaining the coding of coefficient data according to the prior art.
Figure 7:
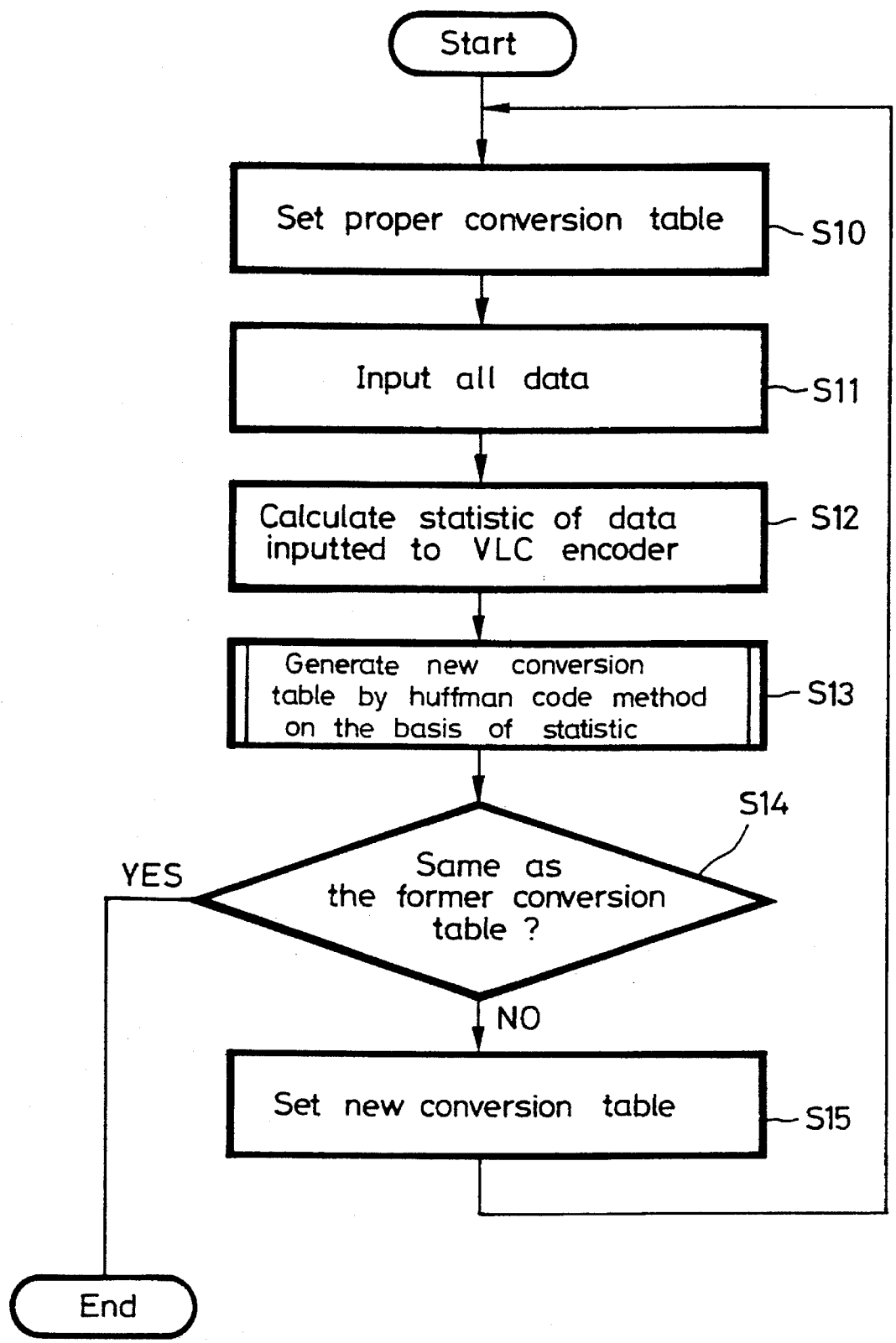
FIG. 7 is a flowchart to which reference will be made in explaining how to generate a variable length code table according to the prior art.
Figure 8:
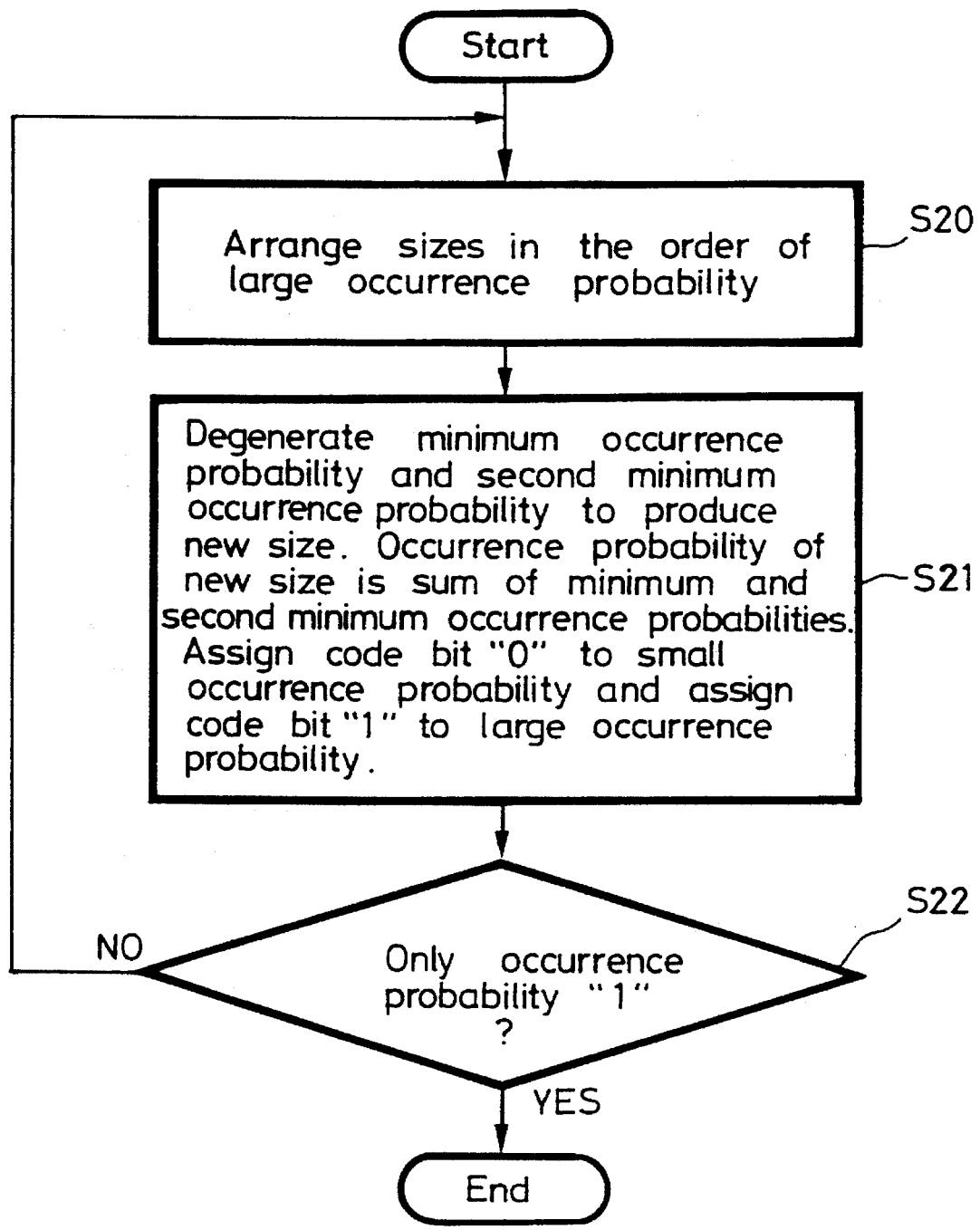
FIG. 8 is a flowchart to which reference will be made in explaining how to make variable length codes by a Huffman coding method according to the prior art.

In step S53, a new table is generated on the basis of the statistic data according to the Huffman coding method. More specifically, the table data generator 30 generates table data on the basis of multiplied results accumulated in the memory (not shown) during a predetermined period according to the Huffman coding method. The method of generating table data according to the Huffman coding method has been described so far with reference to FIGS. 8 and 9 and therefore need not be described. Then, the processing proceeds to the next decision step S54.

It is determined in decision step S54 whether or not the new table is the same as the former table. If a YES is outputted at decision step S54, then the processing is ended. If a NO is outputted at decision step S54, then the processing proceeds to step S55. The judgement of a NO means that the code length is converged.

In step S55, the new table is set in the quantization controller 23, and the processing proceeds to returns to step S51. Then, the processing is repeated until the code length is converged. In accordance with the present invention, data is weighted so that the occurrence probability of data having much distortion amount is increased. For this reason, there is initially set the variable length code table in which a code length for data having much distortion is reduced a little. Therefore, the code length is converged so as to become a proper code length by repeating the flowchart shown in FIG. 11. Finally, it is possible to generate a table in which can be made sufficiently practical from input data of relatively small kind.

In practice, as the distortion amount, there was obtained a square of sum total of difference between the original data and rearranged data corresponding to the original data at every sync. block. Then, a statistic amount was obtained by multiplying the occurrence probability of an information source of the corresponding sync. block with the resultant distortion amount. About 60 frames of 625/50-system still pictures (natural pictures) were prepared as input data and a size conversion code table was arranged. In this case, although there is a very small information amount of 60 frames, a table in which a distortion of input data which is very difficult to be compressed can be prevented from being increased substantially could be formed by the method according to this embodiment.

According to this embodiment, the statistic data from the quantizer 24 and the distortion amount data which results from calculating the distance between the rearranged data from the distortion detecting circuit 28 and the original data are multiplied with each other. The multiplied result is accumulated at every sync. block, and table data is generated according to the Huffman coding method on the basis of the accumulated value. Then, the table data thus generated is supplied to the quantization controller 23 until the variable length code is converged. Therefore, it is possible to generate the table which can provide sufficiently practical codes from input data of relatively limited kind.

Since input data (which is difficult to be reduced and which is low in S/N) having a large distortion can be improved in S/N and thus an average high S/N can be obtained.

While the table is generated on the basis of one-dimensional information as described above, the present invention is not limited thereto and the table can be obtained similarly on the basis of a two-dimensional information source in which runs and sizes are combined, such as the JPEG (Joint Picture Expert Group) or more. Furthermore, parameters of image other than the distortion can be multiplied with the occurrence probability and used.

According to the present invention, since the input data is compressed, the input data thus compressed is expanded, the distortion amount obtained after the input data was compressed and expanded is detected by comparing the input data and the compressed and expanded data, and the variable length code table is obtained on the basis of the statistic data and distortion data thus compressed, it is possible to generate the table which can provide sufficiently practical code from input data of relatively small kind. Further, since the input data (which is difficult to be reduced and which is low in S/N) having a large distortion can be improved in S/N, there can be obtained an average high S/N.

Further, according to the present invention, input data is compressed by a compressing unit, the input data compressed by the compressing unit is expanded by the expanding unit, the input data and the data compressed by the compressing unit and expanded by the expanding unit are compare with each other, the distortion amount obtained after the input data was compressed and then expanded is detected by the distortion amount detecting means and the variable length code table is generated by the variable length code table generating table on the basis of the statistic data from the compressing unit and the detected result from the distortion amount detecting means, there can be obtained the table in which sufficiently practical codes can be obtained from input data of relatively small kind. Further, since the input data (which is difficult to be reduced and which is low in S/N) having a large distortion can be improved in S/N, there can be obtained an average high S/N.

Furthermore, according to the present invention, since the new statistic data considering the distortion amount is obtained on the basis of the statistic data and the detected result when the variable length code table is generated, it is possible to generate the table in which S/N of data which is difficult to be compressed can be improved with the above-mentioned effects being achieved.

Furthermore, according to the present invention, since the statistic data considering the distortion amount is accumulated during a predetermined period and the table is generated on the basis of the accumulated statistic data, the processing can be made simple by effecting the processing at every sync. block and statistic data corresponding to the sync. blocks can be obtained.

Having described a preferred embodiment of the invention with reference to the accompanying drawings, it is to be understood that the invention is not limited to that precise embodiment and that various changes and modifications could be effected therein by one skilled in the art without departing from the spirit or scope of the invention as defined in the appended claims.

What is claimed is:

1. An apparatus for generating a variable length coding comprising:

compressing means for variable-length-code compressing input data and outputting statistic data representing an occurrence probability corresponding to a compressed code value obtained when input data is variable-length-coded;

expanding means for expanding data compressed by said compressing means;

distortion amount detecting means for detecting a distortion amount of output data from said expanding means by comparing the output data from said expanding means and said input data; and variable length code table generating means for generating a variable length code table on the basis of statistic data outputted from said compressing means and a distortion amount outputted from said distortion amount detecting means.

2. The apparatus according to claim 1, wherein said variable length code table generating means weights said statistic data such that an occurrence probability of input data with large distortion amount is increased and generates on the basis of weighted statistic data a variable length code table in which a code word of shorter code length is assigned to input data having a high occurrence probability.

3. The apparatus according to claim 2, wherein said variable length code table generating means includes means for multiplying said statistic data and said distortion amount and generates said variable length code table on the basis of a multiplied result.

4. The apparatus according to claim 3, wherein said variable length code table generating means accumulates said multiplied result during a predetermined period and generates said variable length code table on the basis of said multiplied result thus accumulated.

5. A method of generating a variable length code, comprising the steps of:

variable-length-code compressing input data;

generating statistic data representing an occurrence probability of data corresponding to a length of a compressed code word obtained when said input data is compressed;

expanding said compressed data;

detecting a distortion amount of said input data compressed and expanded by comparing said compressed and expanded data and said input data; and generating a variable length code table on the basis of said statistic data and said distortion amount.

6. The method according to claim 5, wherein said statistic data are weighted so that an occurrence probability of input data with large distortion amount is increased, and a variable length code in which a code word of shorter code length is assigned to input data having a high occurrence probability on the basis of statistic data thus weighted.

7. The method according to claim 6, wherein said statistic data and said distortion amount are multiplied and said variable length code table is generated on the basis of a multiplied result.

8. The method according to claim 7, wherein said multiplied result is accumulated during a predetermined period and said variable length code table is generated on the basis of said multiplied results thus accumulated.

\* \* \* \* \*